United States Patent [19]

Eggleston et al.

[11] Patent Number: 4,987,378
[45] Date of Patent: Jan. 22, 1991

[54] FEEDFORWARD PREDISTORTION LINEARIZER

[75] Inventors: Brian E. Eggleston, Pittstown; Allen Katz, Trenton, both of N.J.

[73] Assignee: General Electric Company, East Windsor, N.J.

[21] Appl. No.: 442,876

[22] Filed: Nov. 28, 1989

[51] Int. Cl.$^5$ .............................................. H03F 1/32
[52] U.S. Cl. ..................................... 330/149; 328/163
[58] Field of Search ................. 330/149, 151; 328/163

[56] References Cited

U.S. PATENT DOCUMENTS

| | | | |
|---|---|---|---|
| 4,453,133 | 6/1984 | Travis | 330/149 |
| 4,517,521 | 5/1985 | Preschutti et al. | 330/2 |
| 4,532,478 | 7/1985 | Silagi | 330/151 |
| 4,588,958 | 5/1986 | Katz et al. | 330/149 |
| 4,629,996 | 12/1986 | Watanabe et al. | 330/151 |
| 4,698,597 | 10/1987 | Merli et al. | 328/163 |

OTHER PUBLICATIONS

Nojima et al., "Predistortion Nonlinear Compensator for Microwave SSB-AM System," *The Proceedings of ICC80*, The 1980 International Conference on Communications, Seattle, WA, Jun. 8-12, 1980.

"Linearization Techniques for Travelling Wave Tube and Solid State Power Amplifiers", by Kumar, published by RCA David Sarnoff Research Center, date not included.

*Primary Examiner*—James B. Mullins
*Attorney, Agent, or Firm*—William H. Meise

[57] ABSTRACT

A feedforward predistortion equalizer includes a first loop with a signal divider for dividing signals into first and second portions, and a distortion generator for distorting the second signal. The first loop is completed by a signal combiner which combines the undistorted first signal and the distorted second signal. The phase and amplitude of the signals in the loop are controlled so that the linear or carrier signal component is cancelled, leaving at the output of the first combiner only the distortion component of the distorted signal. A second loop includes phase and amplitude controls for combining the pure distortion and undistorted signals to produce the desired predistorted signals. In a particular embodiment, the phase and amplitude controls of the first loop are automatically adjusted for a null.

14 Claims, 8 Drawing Sheets

FEEDFORWARD PREDISTORTION LINEARIZER

This invention relates to predistortion circuits for compensating amplitude and phase distortion of power amplifiers, and especially to microwave or millimeter-wave (radio-frequency) predistortion linearizers or equalizers in which the signal is split, passed through plural separate channels in a feedforward manner, and recombined.

Electronic signal amplifiers are used to increase a voltage, current or power of electrical signals. Ideally, amplifiers merely increase the signal amplitude without affecting the signal in any other way. However, all signal amplifiers distort the signal being amplified. The distortion results from nonlinearity of the transfer function or characteristic of the active devices of the amplifier. The distortion of a signal passing through an amplifier can be reduced by keeping the peak-to-peak signal amplitude small, and by operating the amplifier so that the signal traverses the central part of its transfer characteristic, at which it is most linear. However, there are certain situations in which it is necessary for the output signal excursion to extend over a substantial part of the amplifier transfer function. This is true in the case of radio and television broadcast transmitters, where such operation is important in order to obtain the maximum possible output power from each costly amplifier. This condition also exists in the case of microwave or millimeter-wave frequency (Radio Frequency or RF) amplifiers for satellite communications, because the ability of the active devices to operate at RF requires a structure which allows them to be operated only at relatively moderate voltage and current bias levels, so that the signal swing constitutes a significant portion of the available bias, and therefore of the overall transfer function of the amplifier. When the output signal swing of an amplifier makes excursions over substantial portions of the transfer function, the usual effect is a relative compression of large signals by comparison with small signals, i.e. the gain of the amplifier at large signal levels tends to be less than the gain at low signal levels. For the case of a sinusoidal signal viewed on an oscilloscope, the compressed output signal is a sinusoid generally similar in appearance to the input signal, but with a somewhat flattened top and bottom. Radio frequency amplifiers are often used to amplify a plurality of signals, as in multichannel satellite operations. When multiple signals are amplified, the peak signal values occasionally become superposed, causing sum excursions with large peak-to-peak values. In the case of multichannel signals, compression may not be as easy a measurement to make as intermodulation distortion measurements. Intermodulation distortion measurements are ordinarily made by measuring the relative amount of unwanted products which accompany one of the carriers.

A well known technique predistorts the signal applied to a nonlinear amplifier in order to precompensate for the expected distortion caused by the amplifier's nonlinearity. Among the problems which arise in the design of predistortion circuits is that of finding a nonlinear device and corresponding circuit configuration which together have a gain which increases with increasing level, and which will therefore compensate for the decrease in gain caused by the amplifier nonlinearity. Another problem lies in the matching of the nonlinearity of the nonlinear device to that of the amplifier both in amplitude and in phase. That is, the increase in gain with increasing signal level due to predistortion must substantially match the decrease in gain with increasing level attributable to the amplifier. If the system with which the predistortion equalizer is used will be operated at various power levels, the matching of nonlinearity must occur over the desired range of values.

Figure 1A:
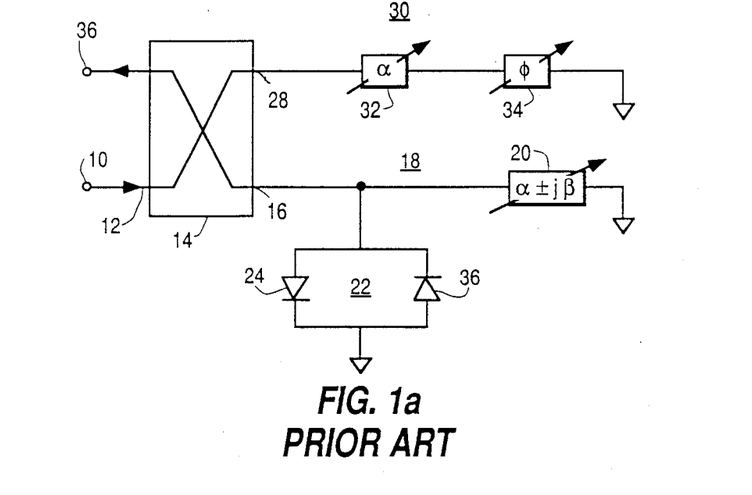
FIG. 1a is a simplified block diagram of a reflective predistortion equalizer.

FIG. 1a is a simplified block diagram of a typical prior art reflective predistortion equalizer. In FIG. 1a, signals to be predistorted are applied by way of an input terminal 10 to a first input port 12 of a 90°, 3dB hybrid coupler 14. Signals with nominally zero phase shift are coupled from directional coupler 14 by way of an output port 16 to a nonlinear network designated generally as 18, which includes an attenuator and phase shifter illustrated together as a block 20, and also includes a short-circuit. The nonlinearity is provided by a distortion generator, designated generally as 22. The particular form of distortion generator illustrated in FIG. 1A is a pair of antiphase diodes 24, 26 as known in the art, for example, from U.S. Pat. No. 4,588,958, issued May 13, 1986, to Katz et al. Signals applied to input port 12 are also coupled with a nominal 90° phase shift to an output port 28 for application to a linear channel designated generally as 30, which includes the cascade of a variable attenuator 32 and a phase shifter 34 terminated in a short-circuit. Signals applied to input terminal 12 are coupled into nonlinear channel 18 and into linear channel 30, and are processed and reflected, and are coupled together and to an output port 36. Reflective linearizers such as that of FIG. 1a tend to have a narrow bandwidth, and are difficult to align.

Figure 1B:
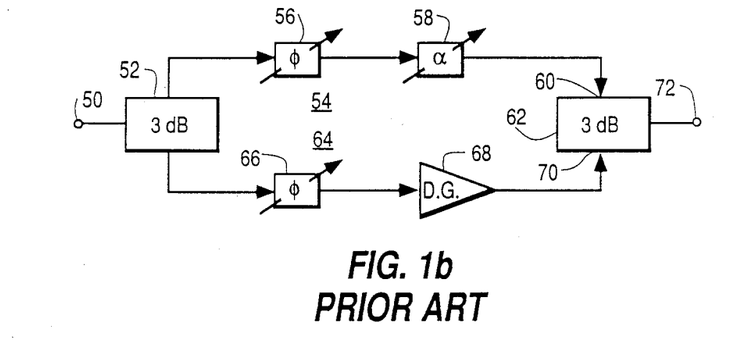
FIG. 1b is a simplified block diagram of a prior art transmission predistortion equalizer.

FIG. 1b is a simplified block diagram of a transmissive predistortion equalizer. In FIG. 1b, signals to be predistorted are applied by way of an input port 50 to a 3dB hybrid splitter or coupler 52, which divides the signal into a first portion which is applied to a linear upper transmission path designated generally as 54, and a second portion which is applied to a nonlinear lower transmission path designated generally as 64. Linear path 54 includes the cascade of a controllable phase shifter 56 and a controllable attenuator 58. The attenuated and phase shifted signals produced at the output of linear channel 54 are applied to a first input port 60 of a 3dB hybrid combiner 62. Lower nonlinear channel 64 includes the cascade of a controllable phase shifter 66 and a distortion generator 68. The phase shifted and distortion-added signal at the output of nonlinear channel 64 is applied to a second input port 70 of 3dB hybrid combiner 62 for producing at output port 72 of 3dB hybrid 62 the combination of a linear and nonlinear signal for application to a power amplifier (not illustrated) which may be connected to output port 72. Distortion generator 68 may be a diode generator such as is illustrated in FIG. 1a if sufficient input power is available, or it may include an amplifier which tends to saturate at the operating signal levels, as known in the art. While transmission-type linearizers such as that of FIG. 1b tend to have a greater frequency bandwidth than reflective linearizers, they still have a relatively narrow bandwidth, and are difficult to align.

An improved form of predistortion equalizer is desired, in which the distortion nonlinearity is readily matched to the amplifier, both in amplitude and in phase.

SUMMARY OF THE INVENTION

A predistortion equalizer according to the invention includes a first signal divider including an input port adapted to be coupled to a source of signal which is to be predistorted, and also including first and second output ports. The first signal sampler or divider divides the signal into first and second portions, which may be of equal or unequal amplitude. The second portion of the divided signal from the first signal divider is applied to a distortion generator for associating distortion products therewith. A second signal sampler or divider has an input port coupled to the first output port of the first signal divider for generating first and second parts of the signal. A first signal combiner has a first input port coupled to the distortion generator and a second input port coupled to the second output port of the second signal divider. The connections of the first signal combiner complete a loop in which the distorted signals are combined with the second signal part. A phase and amplitude control arrangement is coupled with the first loop for controlling the relative phase and amplitude of the combined distorted signals at the output of the first signal combiner. The phase and amplitude are adjusted in a manner which tends to cancel all of the signal at the output of the first signal combiner except the distortion component, which becomes available for recombination with the linear signal. A second signal combiner is coupled to the second signal divider and to the first signal combiner for forming a second loop by which the linear signals are combined with the separated distortion component to provide a predistorted signal. In a particular embodiment of the invention, further phase and amplitude control arrangements are coupled to the second loop for controlling the relative phases and amplitudes of the distortion component relative to the linear portion of the signal. In a further embodiment of the invention, a control arrangement is coupled to the output of the first signal combiner and to the first phase and amplitude control arrangement for reducing the amplitude of the signal at the output of the first signal combiner, thereby providing automatic control of the nulling of the linear component to improve the isolation between the separated distortion component and the linear signal component.

DESCRIPTION OF THE INVENTION

Figure 2:
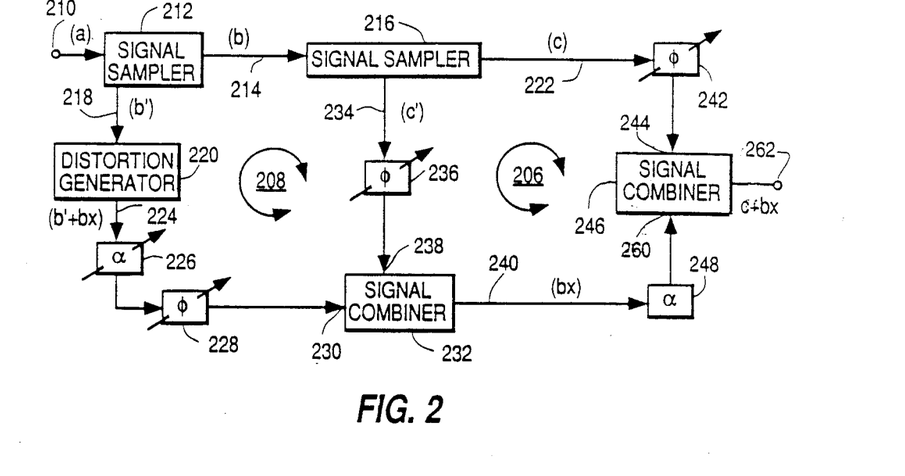
FIG. 2 is a simplified block diagram of a predistortion equalizer in accordance with the invention.

FIG. 2 is a simplified block diagram of a predistortion equalizer in accordance with the invention. In FIG. 2, signals to be predistorted are applied by way of an input port 210 to a signal sampler 212. Signal sampler 212 divides the signal into two portions, a first portion of which is applied over a conductor 214 to a second signal sampler 216, and a second portion of which is applied over a conductor 218 to a distortion generator illustrated as a block 220. Signal sampler 212 may be a directional coupler or it may be a resistive tap such as that illustrated in FIG. 7. Distortion generator 220 associates distortion components with the signal sample applied to its input, to produce a distorted signal on an output conductor 224. The distorted signal on conductor 224 is applied by way of a controllable attenuator ($\alpha$) 226 and a controllable phase shifter ($\phi$) 228 to an input terminal 230 of a signal combiner 232.

Signal sampler 216 of FIG. 2 couples a first sample of the signal applied to its input terminal by way of an output conductor 222 to a controllable phase shifter 242, and a second part of the signal by way of a conductor 234 and a phase shifter 236 to an input port 238 of signal combiner 232. These connections establish a first circuit loop designated generally as 208. Signal combiner 232 combines the signals applied to its input ports 230 and 238 from loop 208 and produces a combination or sum signal on an output conductor 240.

The linear signal on conductor 222 of FIG. 2 is applied by way of a controllable phase shifter 242 to an input port 244 of a signal combiner 246. The nonlinear signal on conductor 240 is applied by way of a controllable attenuator 248 to an input port 260 of signal combiner 246. These connections establish a second circuit loop designated generally as 206. Signal combiner 246 combines the linear signal applied to its input port 244 with the nonlinear signal applied to its input port 260 to produce a predistorted signal on output port 262. The predistorted signal is applied to the input of a main amplifier (not illustrated).

In operation of the arrangement of FIG. 2, the linear input signal to be predistorted (designated "a" in FIG. 2) is divided into a first portion (b) on a conductor 214 and a second portion (b') on conductor 218. Distortion generator 220 adds distortion (bx) to sampled signal portion (b') to produce a combination of linear signal and distortion (b'+bx) on conductor 224. The linear signal portion (b) on conductor 214 is sampled in sampler 216 to produce a signal part (c) on conductor 222 and a further part (c') on conductor 234. Signal part c' on conductor 234 is phase shifted by phase shifter 236 which is adjusted, in combination with the shift provided to signal portion (b'+bx) by phase shifter 228, so that sample c' is phase inverted with respect to the linear component b' of the distorted signal applied to input port 230 of signal combiner 232. When the amplitudes of the linear signal components b' and c' are equal, and their phases are exactly opposite, the linear components cancel in signal combiner 232, leaving only the distortion component (bx) on conductor 240.

Linear component c on conductor 222 of FIG. 2 and distortion bx on conductor 240 are adjusted in amplitude and phase by phase shifter 242 and attenuator 248, respectively, before combination in signal combiner 246, to provide the desired phase and amplitude relation between the components of combined predistorted signal c+bx appearing at output port 262.

Figure 3:
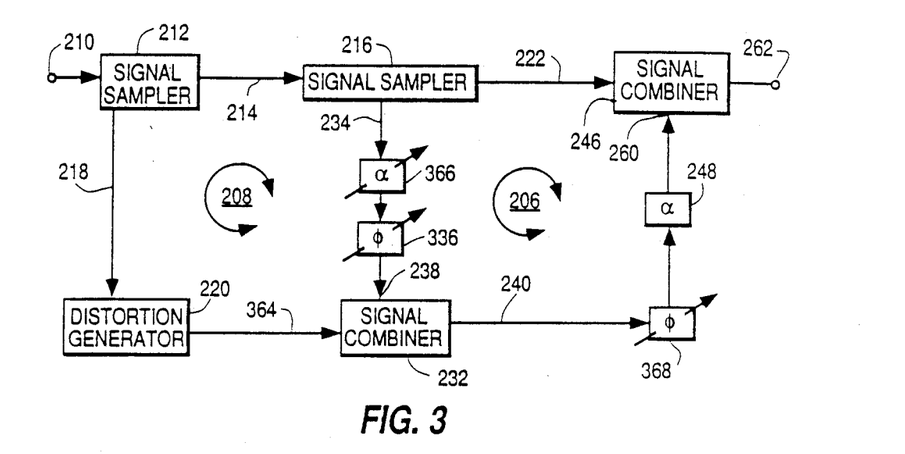
FIG. 3 is a simplified block diagram of another embodiment of a predistortion equalizer in accordance with the invention.

FIG. 3 is a simplified block diagram of another embodiment of the invention. The embodiment of FIG. 3 is similar to the embodiment of FIG. 2, and corresponding elements are designated by the same reference numerals. In FIG. 3, controllable attenuator 226 and controllable phase shifter 228 of FIG. 2 are deleted and are replaced by a through path 364, and phase shifter 236 of FIG. 2 is deleted and is replaced by the cascade of a controllable phase shifter 336 and a further controllable attenuator 366. Also, controllable phase shifter 242 of FIG. 2 is removed from the path between signal sampler 216 and signal combiner 246, and is replaced by a through path, and a further controllable phase shifter 368 is cascaded with controllable attenuator 248 in the path between conductor 240 and input port 216 of signal combiner 246. Operation of the arrangement of FIG. 3 is essentially the same as that of the arrangement of FIG. 2.

Figure 4:
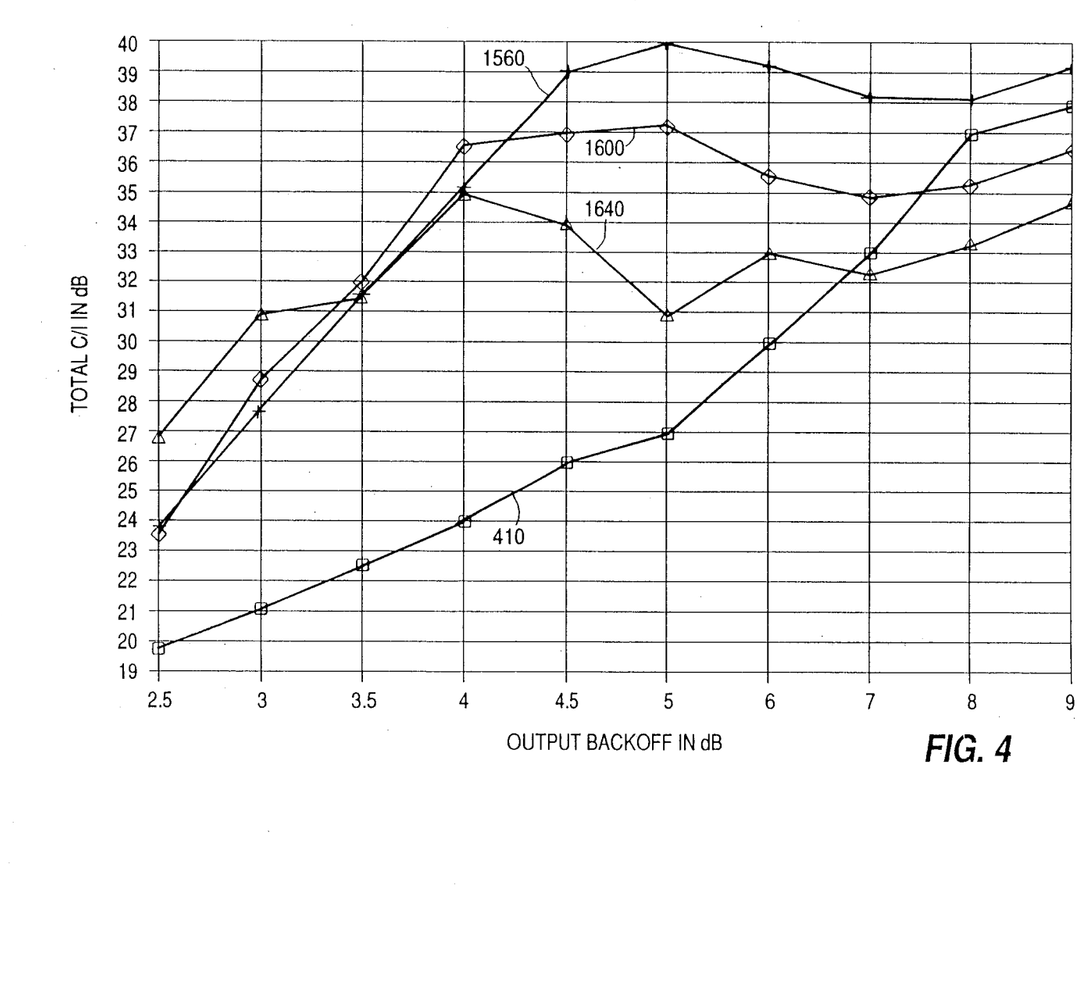
FIGS. 4, 5, and 6 are plots of carrier-to-intermodulation ratio for an embodiment of the invention in association with particular amplifiers.

FIG. 4 includes plots of carrier-to-intermodulation (C/I) distortion of the predistortion equalizer of FIG. 2 in combination with a bipolar monolithic microwave integrated circuit (MMIC), type MSA0735 manufactured by AVANTEK. In FIG. 4, plot 410 represents the C/I of the MMIC amplifier alone, with input signals near 1.6GHz. At small amounts of backoff from a condition of nearly full compression of the signals, such as 2.5dB backoff, the C/I is near 20dB (intermodulation components are 20dB below the carrier amplitude). Plots 1560, 1600 and 1640 represent the C/I of the amplifier with the equalizer at frequencies of 1560 MHz, 1600 and 1640 MHz, respectively.

Figure 5:
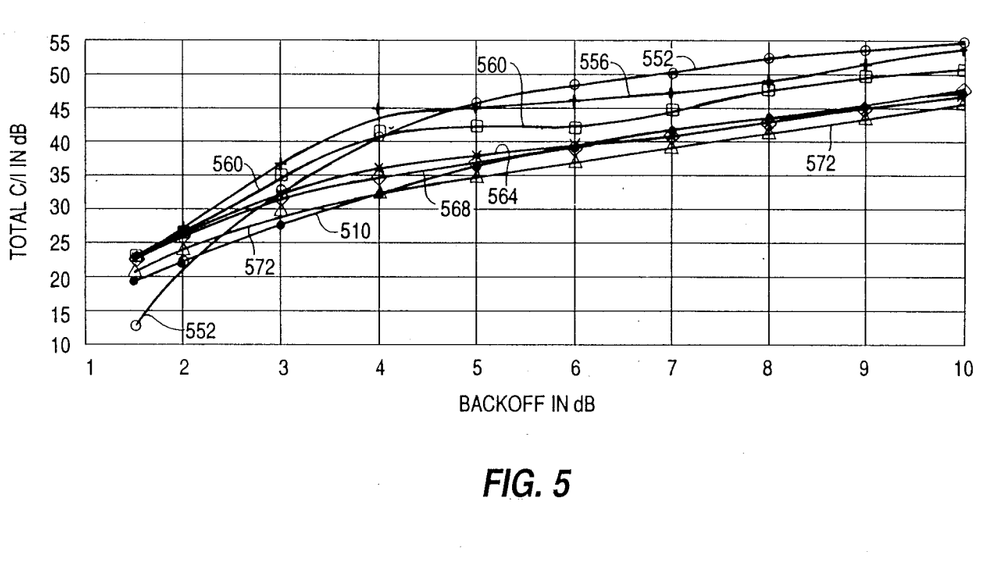

FIG. 5 is a plot of C/I versus backoff for a combination of the predistortion equalizer of FIG. 2 in combination with a GaAs FET MMIC amplifier, manufactured by Nippon Electric Company. In FIG. 5, plot 510 represents the amplifier alone at 1.6GHz. Plots 552, 556, 560, 564, 568 and 572 represent the performance of the combination of the amplifier with the predistortion equalizer at frequencies of 1.52, 1.56, 1.6, 1.64, 1.68 and 1.72 GHz, respectively.

Figure 6:
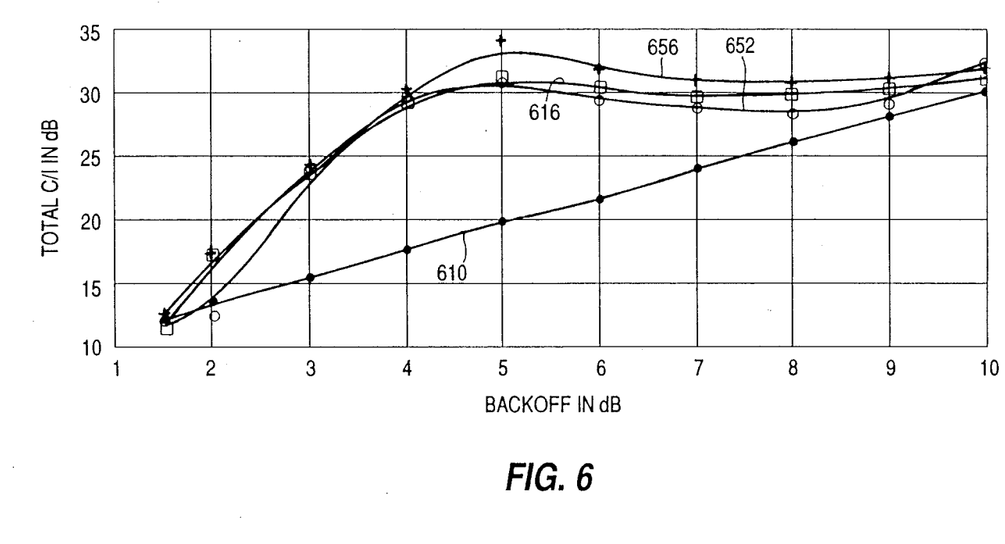

FIG. 6 is a similar plot of C/I versus backoff for a combination of the predistortion equalizer of FIG. 2 with a travelling-wave tube (TWT) amplifier manufactured by Hughes. In FIG. 6, plot 610 represents the performance of the TWT alone at 1.6GHz. Plots 652, 656 and 616 represent the operation of the combination at 1.52, 1.56 and 1.60 GHz, respectively.

Figure 7:
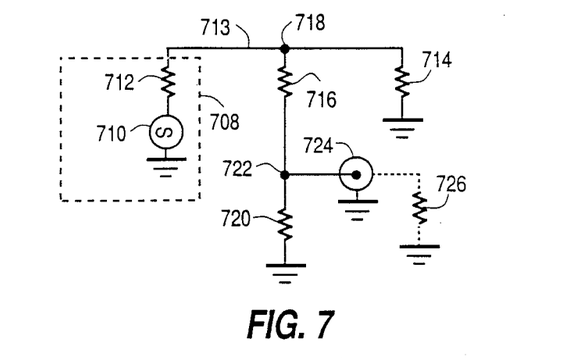
FIG. 7 is a schematic diagram illustrating a resistive signal sampler or combiner for use in the arrangements of FIGS. 2 or 3.

FIG. 7 is a simplified schematic diagram of a resistive signal sampler or combiner which may be used in conjunction with the arrangement of FIGS. 2 or 3. In FIG. 7, a signal source 708 is illustrated as including a generator 710 with an internal impedance 712, and is connected by way of a transmission line illustrated as a conductor 713 to a matched load 714. One end of a resistor 716 is connected to conductor 713 at a node 718 for tapping a signal sample therefrom, and is connected at a node 722 to a further resistor 720 to form a signal or voltage divider extending between node 718 and ground. A tap port 724 is coupled to node 722. A resistor 726 represents the load coupled to port 724.

For many purposes, the arrangement of FIG. 7 may provide performance of a nature similar to that provided by a directional coupler, but without the directional characteristic. For example, in a 50-ohm system, resistors 712, 714, and 726 are taken as having a resistance of 50 ohms. If resistor 716 is 390 ohms, and resistor 720 is 56 ohms, a tap attenuation (the attenuation between generator 708 and tap load 726) will be about 26dB. Tap port 724 presents an impedance of about 51 ohms to its load. The isolation between port 724 and load 714 is of the same order of magnitude, and may be sufficient when used in place of samples 212 of FIG. 2 to prevent distortion generated by distortion generator 220 from significantly corrupting the linear signal coupled to conductor 214. Resistive arrangements such as that of FIG. 7 may be advantageous when signal levels are high and substantial isolation is permissible. Under other conditions, directional couplers or hybrids may be more advantageous. The arrangement of FIG. 7 also can be used for signal combination, by applying signals to port 724 together with signals from generator 708 to produce combined signals at resistive load 714.

Figure 8:
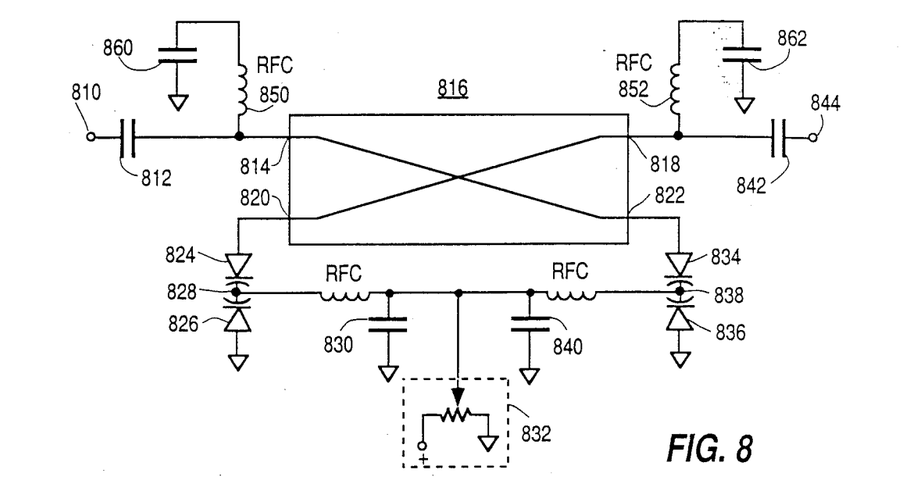
FIG. 8 is a simplified schematic diagram of a controllable phase shifter useful in the arrangements of FIGS. 2 or 3.

FIG. 8 is a simplified schematic diagram of a controllable phase shifter useful in the arrangements of FIGS. 2 or 3. In FIG. 8, signals to be phase shifted are applied by way of an input port 810 and a bias blocking capacitor 812 to a first input port 814 of a hybrid coupler designated generally as 816 which, for operation at 3.95 GHz, may consist of 1.05 inches (26.7 mm) of 0.141-inch (3.57 mm) diameter SAGE transmission line consisting of a twisted conductor pair within a coaxial outer conductor. A pair of mutually back-to-back variable capacitance diodes 824 and 826 are connected between a second input port 820 of directional coupler 816 and ground, with a tap therebetween connected by way of an RF filter including an RF choke (RFC) and a filter capacitor 830 to a source 832 of controllable bias voltage. A second pair of back-to-back variable capacitance diodes 834, 836 has a tap 838 therebetween connected by way of a further RFC and filter capacitor 840 to bias source 832. Output port 818 of directional coupler 816 is coupled by way of a blocking capacitor 842 to an output port 844 at which phase-shifted signals are generated under the control of the bias generated by source 832. Additional RF chokes 850 and 852 block RF from additional filter capacitors 860 and 862, respectively, which provide additional 60Hz filtration to prevent modulation of the variable capacitance diodes.

Figure 9:
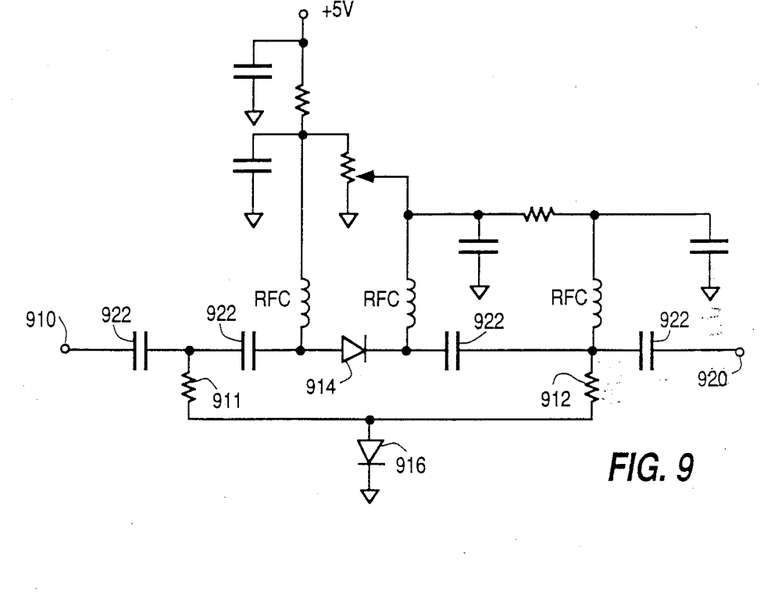
FIG. 9 is a simplified schematic diagram of a bridged-tee attenuator useful in conjunction with the arrangements of FIGS. 2 or 3.

FIG. 9 is a schematic diagram of a controllable attenuator useful in the arrangements of FIG. 2 or 3. In FIG. 9, signals to be attenuated are applied by way of a terminal 910 to a bridged-tee network including first and second resistors 911 and 912 bridged by a first PIN diode 914, with a second PIN diode 916 coupled to ground from their juncture. The attenuated output signals are produced at output port 920. Blocking capacitors 922 and the remainder of the circuit have no effect on the radio frequency performance except for control of the effective resistance of the PIN diodes by control of the bias current therethrough, as is well known in the art.

Figure 10:
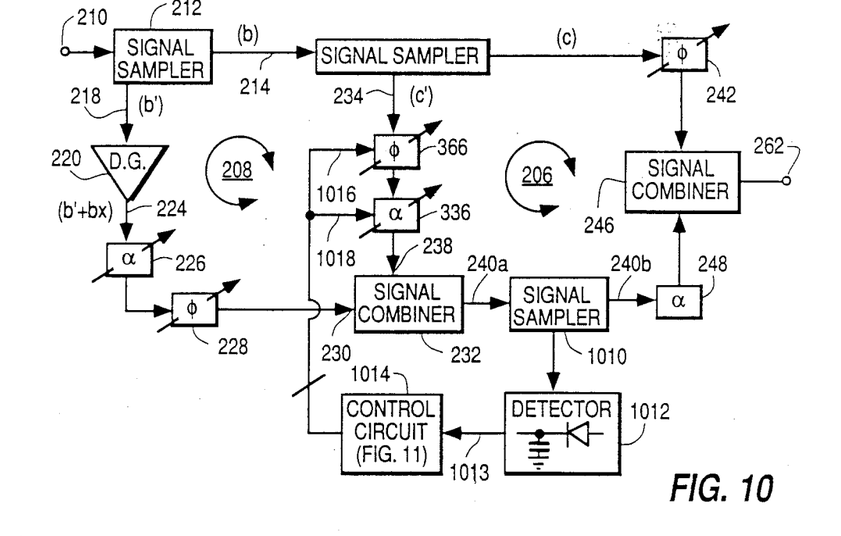
FIG. 10 is a simplified block diagram of a predistortion equalizer in accordance with the invention, including a control circuit for automatic nulling.

FIG. 10 is a simplified block diagram of a predistortion equalizer according to the invention including a control circuit for automatic nulling of the linear component at the output of signal combiner 232. Elements of FIG. 10 corresponding to those of FIGS. 2 and 3 are designated by the same reference numerals. The arrangement of FIG. 10 differs from those of FIGS. 2 or 3 by including a signal sampler 1010 between two portions 240a and 240b of conductor 240 at the output of signal combiner 232. Signal sampler 1010 samples the signal at the output of signal combiner 232 and applies the sampled signal to an amplitude detector 1012, illustrated as a diode detector. Detector 1012 produces an amplitude-representative signal on a conductor 1013 for application to a control circuit illustrated as a block 1014. Control circuit 1014 is coupled to attenuator 336 and phase shifter 366 by way of conductors 1018 and 1016, respectively, and adjusts their amplitudes in order to maintain the amplitude of the signal at the output of signal combiner 232 at its lowest level or smallest magnitude. The smallest magnitude occurs when the linear signal component c' applied to input port 238 of signal combiner 232 is exactly equal to the amplitude of component b' of the distorted signal applied to input port 230 of signal combiner 232 and of opposite phase for total cancellation around loop 208. The smallest amplitude at the output of signal combiner 232 therefore corresponds to the amplitude of the distortion components bx alone. Attenuator 226 and phase shifter 228 of FIG. 10 provide for initial setup of the amplitude and phase in loop 208 with attenuator 366 and phase shifter 336 in the center of their control ranges, but they are not absolutely necessary.

Figure 11:
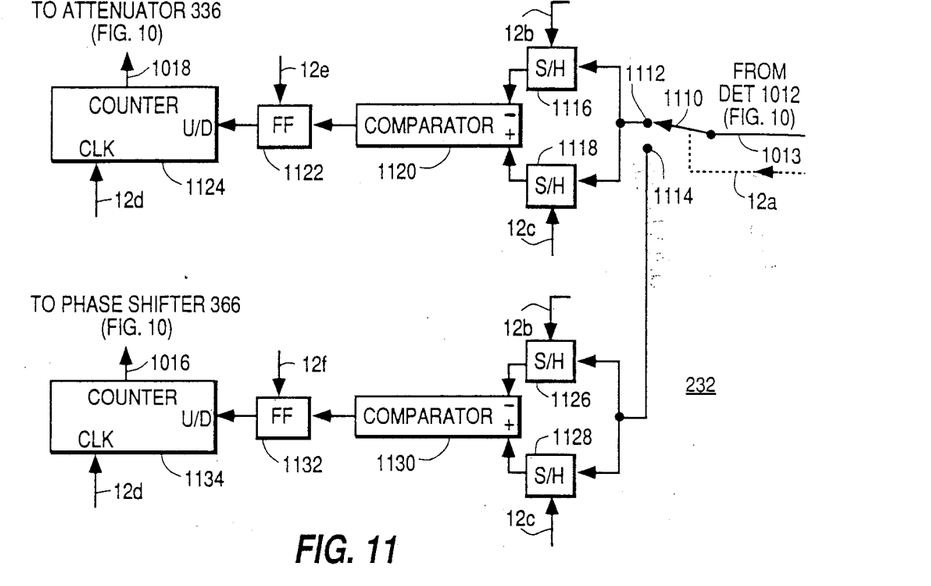
FIG. 11 is a simplified block diagram of a control circuit useful in the arrangement of FIG. 10.

FIG. 11 is a simplified block diagram of a control circuit suitable for use in the arrangement of FIG. 11. In FIG. 11, the signal from detector 1012 of FIG. 10 is applied over conductor 1013 to the common terminal of a switch illustrated for clarity as a mechanical switch 1110, which switches under control of a control path illustrated as 12a. During a first half-cycle of the control signal applied over control path 12a, common element 1110 couples line 1013 to switch terminal 1112 for applying the detector signal to a pair of sample-and-hold (S/H) circuits 1116 and 1118. During the other half-cycle of the clock signal applied over control path 12a, switch element 1110 couples conductor 1013 to a terminal 1114, thereby applying the detector signal to a further pair of S/H circuits 1126 and 1128. The control signal applied over conductor 12a is illustrated as 1210 in FIG. 12a. During the positive-going or upper excursion of signal 1210, conductor 1013 is connected to terminal 1112, applying the detector signal to S/H 1116 and 1118 in relation to control of attenuator 236 of FIG. 10, and during the negative-going or lower portion of the excursion of signal 1210 of FIG. 12a, conductor 1013 is connected to terminal 1114 for applying detector signals to S/H 1126 and 1120 in relation to control of phase shifter 366 of FIG. 10.

Figure 12:
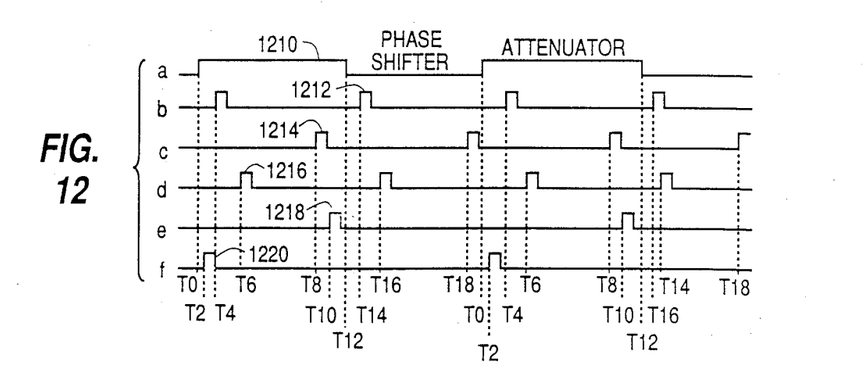
FIG. 12 is an amplitude-time diagram of certain control signals useful in the arrangement of FIG. 11.

During those intervals T0-T12 of FIG. 12 in which detector signals are applied to S/H 1116 and 1118, S/H 1116 is controlled to take a sample at a relatively early time, such as time T4 of FIG. 12, by a control signal illustrated as 1212 of FIG. 12b, which is applied to S/H 1116 over conductor 12b of FIG. 11. This sample represents the "before adjustment" sample of a pair of samples. At a somewhat later time, such as time T8 of FIG. 12, another control signal, illustrated as 1214 of FIG. 12c, is applied over conductor 12c to S/H 1118 of FIG. 11, to cause an "after adjustment" sample of the detector signal to be taken. If the "after" sample is greater in magnitude than the "before" sample, adjustment has been made in the wrong direction, whereas if the "after" sample is smaller in magnitude than the "before" sample, the detected signal is getting smaller, and nulling of the carrier or linear signal is occurring at the output of signal combiner 232 of FIG. 10.

A comparator 1120 of FIG. 11 is coupled to the outputs of S/H 1116 and 1118. For a positive detected signal the polarities of the inputs illustrated in FIG. 11 result in a positive-going output signal if adjustment is in the wrong direction, and a negativegoing output signal if the adjustment is in the right direction. The output of comparator 1120 is applied to a gating or inhibiting input terminal of a controllable flip-flop (FF) 1122, which also receives a clock signal over conductor 12e. The clock signal is illustrated as 1218 of FIG. 12e. The signal applied to FF 1122 of FIG. 11 from comparator 1120 inhibits clocking of the FF, and therefore prevents it from changing state, so long as adjustment continues to be in the right direction. Adjustment in the wrong direction results in enabling of FF 1122, whereupon at time T10 of FIG. 12, the next clock pulse 1218 of FIG. 12e changes the state of the FF. A counter 1124 has a clock (CLK) input coupled to receive clock signals applied over a conductor 12d, an up-down (U/D) control input coupled to the output of FF 1122, and produces a digital word on a data path 1018 for controlling the attenuation of attenuator 336 of FIG. 10. The count of counter 1124 changes recurrently at times T6 and T16 of the cycle extending from T0 to the next following time T0 in FIG. 12, either incrementing or decrementing in response to the state of FF 1122, and thereby adjusting the attenuation of attenuator 336 of FIG. 10.

In operation of the control circuit of FIG. 11, when the linear or carrier component is far from being nulled at the output of signal combiner 232 of FIG. 10, the state of FF 1122 of FIG. 11 may initially be such that clocking of counter 1124 results in an increment, whereupon the count increases at time 1216, between times T4 and T8 during which S/H 1116 and 1118, respectively, are enabled for sampling. Thus, the output of S/H 1116 represents a sample of the detected signal before adjustment of the attenuator 336, and S/H 1118 represents the sample after adjustment. If the magnitude of the sample taken by S/H 1118 at time T8 exceeds the magnitude of the sample taken by S/H 1116 at time T4, the adjustment of attenuator must have been in the wrong direction. Comparator 1120 responds with a positive output, which enables FF 1122. At the next time T10 of FIG. 12, FF 1122 changes state in response to a clock pulse 1218 of FIG. 12e. This has the effect of causing counter 1124 to decrement its count at the following time T16 of the cycle in response to clock signal 1216 of FIG. 12d. The decrement of count of counter 1124 causes a decrease of attenuation of attenuator 336 of FIG. 10, which will improve the nulling at the output of combiner 232 of FIG. 10. This in turn decreases the detected signal on conductor 1013 of FIGS. 10 and 11. At the next time T4, a sample is again taken by S/H 1116. The counter again decrements at time T6 in response to signal 1216, and another sample is again taken by S/H 1118. So long as the adjustment continues to be in the correct direction for nulling, comparator 1120 inhibits FF 1122 to prevent it from changing state, so counter 1124 continues to decrement monotonically, improving the nulling.

At some point, the attenuation of attenuator 336 of FIG. 10 will become greater than is necessary for a good null. The "after" signal on S/H 1118 will then exceed that of "before" S/H 1116. Comparator 1120 will produce a negative output signal, which enables FF 1122. At the next time T10, FF 1122 will change state, thereby causing counter 1124 to begin incrementing its count in response to clock signals 1216 of FIG. 12d. This causes the attenuation of attenuator 336 to again increase. Thus, the control system of FIG. 11 causes the attenuator of attenuator 336 to vary about a value of optimum attenuation, maintaining it near a value which provides the best null.

The remainder of the control system of FIG. 11 is an identical portion including S/H 1126 and 1128, comparator 1130, FF 1132, and counter 1134, which respond to the same signals in the same manner, except that FF 1132 responds to clock signal 1220 of FIG. 12f rather than clock signal 1218 of FIG. 12e, for control of phase shifter 366 of FIG. 10.

Other embodiments of the invention will be apparent to those skilled in the art. For example, the signal predistorted by the inventive predistorter may be used with any signal process which results in distortion, such as frequency conversion, where the nonlinear devices of the frequency converter may cause amplitude distortion. The attenuators and phase shifters may be mechanically controlled rather than voltage-controlled, and may be of any suitable form, impedance matched or unmatched.

What is claimed is:

1. A predistortion equalizer for predistorting a signal to be predistorted, comprising:
    first signal dividing means including an input port adapted to be coupled to a source of signal to be predistorted and also including first and second output ports, for producing, from said signal to be predistorted, first and second signal portions at said first and second output ports, respectively, of said first signal dividing means;
    distortion generating means coupled to said second output port of said first signal dividing means for associating distortion products with said second signal portion to produce combined distorted signals;
    second signal dividing means including an input port coupled to said first output port of said first signal dividing means for receiving said first signal portion therefrom, and also including first and second output ports, for dividing said first signal portion received from said first signal dividing means into first and second signal parts at said first and second output ports, respectively, of said second signal dividing means;
    first signal combining means including a first input port coupled to said distortion generating means and a second input port coupled to said second output port of said second signal dividing means, and also including an output port, for completing a first loop for combining said combined distorted signals with said second signal part;
    first phase and amplitude control means coupled with said first loop for controlling the relative phase and amplitude of said combined distorted signals and said second signal portion in a manner tending to cancel all but the distortion component of said combined distorted signals, whereby said distortion component is produced at said output port of said first combining means; and
    second combining means including a first input port coupled to said first output port of said second signal dividing means and a second input port coupled to said output port of said first signal combining means thereby completing a second loop, said second combining means also including an output port, for combining said first signal part with said distortion component to produce predistorted signal at said output port of said second signal combining means.

2. An equalizer according to claim 1 further comprising second phase and amplitude control means coupled to said second loop for controlling the relative phase and amplitude of said distortion component and said first signal part of said predistorted signal.

3. An equalizer according to claim 2 wherein said second phase and amplitude control means comprises amplitude control means coupled in a signal path extending between said output port of said first signal combining means and said second input port of said second signal combining means.

4. An equalizer according to claim 1 wherein said first signal dividing means comprises a directional coupler in which said input port is a common port, and which provides isolation between said first and second output ports.

5. An equalizer according to claim 1 wherein said first signal dividing means comprises a resistive tap.

6. An equalizer according to claim 1 wherein one of said second signal dividing means and said first signal combining means comprises a directional coupler.

7. An equalizer according to claim 6 wherein said directional coupler is a 3dB coupler.

8. An equalizer according to claim 1 wherein said distortion generating means comprises amplifying means.

9. An equalizer according to claim 1 wherein said first phase and amplitude control means comprises phase shifting means coupled in a signal path extending between said second output port of said second signal dividing means and said second input port of said first signal combining means.

10. An equalizer according to claim 1 wherein said first phase and amplitude control means comprises an attenuator coupled in a signal path extending between said second output port of said second signal dividing means and said second input port of said first signal combining means.

11. An equalizer according to claim 1 wherein said first phase and amplitude control means includes phase shifting means and an attenuator coupled in a signal path extending between said second output port of said first signal dividing means and said first input port of said first signal combining means.

12. An equalizer according to claim 1 wherein said second combining means comprises a 3dB hybrid circuit.

13. An equalizer according to claim 1 further comprising signal amplitude sensing means coupled to said output port of said first signal combining means and to said first phase and amplitude control means for controlling said first phase and amplitude means in a manner tending to reduce the amplitude of the signal at said output port of said first signal combining means.

14. An equalizer according to claim 13 in which said signal amplitude sensing means comprises a diode detector for producing a direct voltage representative of the amplitude of said signal at said output port of said first signal combining means.

* * * * *